United States Patent [19]
Distler

[11] 3,970,806
[45] July 20, 1976

[54] MULTIPLE SWITCH

[75] Inventor: Jack Edward Distler, Indianapolis, Ind.

[73] Assignee: Bell Telephone Laboratories, Incorporated, Murray Hill, N.J.

[22] Filed: June 9, 1975

[21] Appl. No.: 585,061

[52] U.S. Cl. .......................... 200/5 R; 74/483 PB; 200/5 B; 200/5 E; 200/50 C; 200/328
[51] Int. Cl.² ..................... G05G 9/00; H01H 9/20
[58] Field of Search ................ 74/483 PB; 200/5 R, 200/5 B, 5 C, 5 E, 5 EA, 5 EB, 30 C, 328, 17 R, 17 BR

[56] References Cited
UNITED STATES PATENTS

| | | | |
|---|---|---|---|
| 2,740,004 | 3/1956 | Baldasare | 200/5 EB |
| 2,831,075 | 4/1958 | Dumke et al. | 200/5 E X |
| 2,935,577 | 5/1960 | Dumke et al. | 200/5 E X |
| 3,164,688 | 1/1965 | Jozefowski | 200/5 EA |
| 3,169,173 | 2/1965 | Woodward | 200/5 EB |
| 3,271,530 | 9/1966 | Wirsching | 200/5 |
| 3,281,544 | 10/1966 | Bailey et al. | 200/5 |

*Primary Examiner*—James R. Scott
*Attorney, Agent, or Firm*—Harry L Newman

[57] ABSTRACT

A multiple switch in accordance with the present invention comprises a plurality of pushbuttons that are movable between an extended and a depressed position and are biased toward the extended position. The pushbuttons are paired and each pushbutton pair is associated with an individual lockout, a releasing-latching bar (RL bar) that is common to all of the pairs, and an individual releasing-nonlatching and releasing-latching bar (RNRL bar). Each pushbutton interacts with all three members when it is depressed.

The lockout permits either pushbutton of the associated pair to be depressed individually but prevents both pushbuttons from being depressed simultaneously. As any pushbutton is depressed, the RL bar acts to release all pushbuttons previously depressed and latches the activated pushbutton in its depressed position. Finally, the RNRL bar interacts with a first pushbutton of the associated pair to release the second pushbutton of the pair if it was previously depressed and interacts with the second pushbutton of the associated pair to latch it in its depressed position. Each RNRL bar interacts with the associated pushbutton pair in conjunction with the RL bar but independent of any other RNRL bar.

12 Claims, 3 Drawing Figures

U.S. Patent July 20, 1976 3,970,806
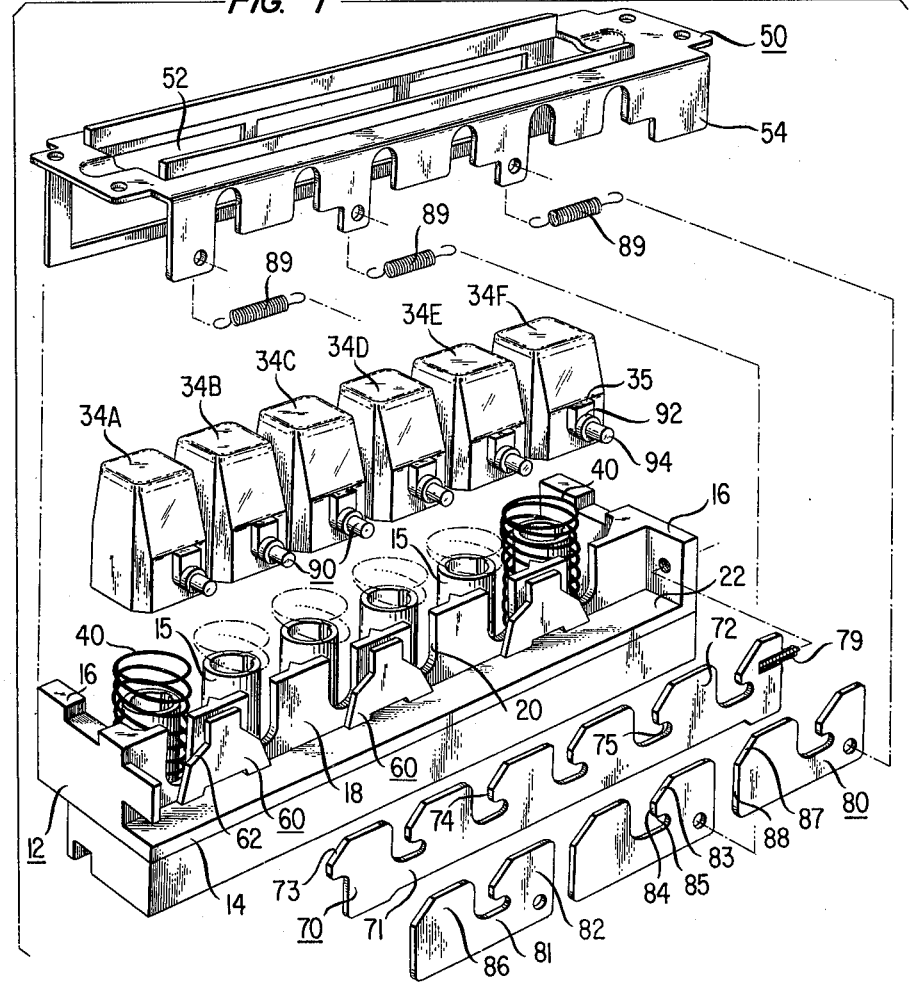
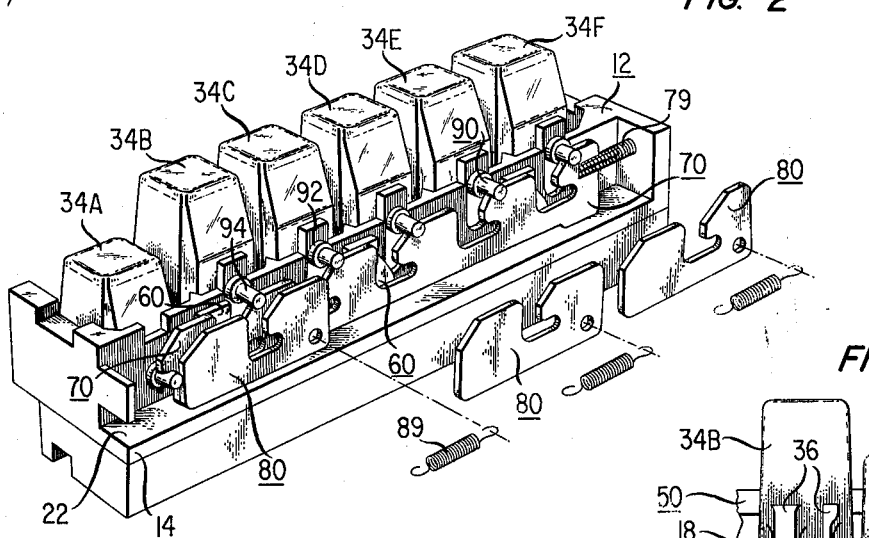
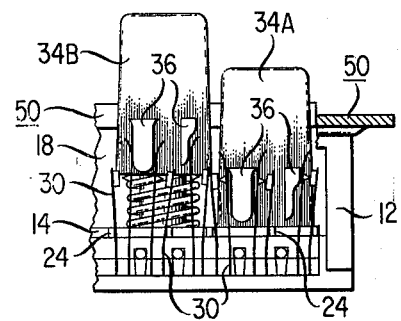

MULTIPLE SWITCH

FIELD OF THE INVENTION

This invention relates to the field of multiple switches, which in the telephone industry are referred to as keys, and within that field to a multiple switch in which the switch actuators are associated in a multiple of pairs.

BACKGROUND OF THE INVENTION

Many telephone subscribers desire to have two or three telephone line service for their business or home. In addition they wish to be able to (1) answer any one of the telephone lines at any telephone set; (2) maintain the connection with a distant party on one line while answering or placing a call at another line (commonly referred to as "placing a line on hold"); and (3) engage in a multiple party conversation in which distant parties on multiple lines can converse with one another (commonly referred to as "conferencing"). While there are key telephone systems that include line control circuits that operate in conjunction with and responsive to the actuation of the keys at associated telephone sets to provide these features, it is desirable when only two or three line service is involved to be able to provide these features without such line circuits.

L. B. Jozefowski U.S. Pat. No. 3,164,688 issued on Jan. 5, 1965, discloses a key that provides only the first two of these features. More specifically, Jozefowski discloses a multiple pushbutton key in which adjacent pushbuttons are paired and associated with an individual telephone line. A first pushbutton of each pair, referred to as a talk, pick-up, or line button, is adapted when depressed to connect the speech network of the telephone set to the associated telephone line. The second pushbutton of each pair, referred to as a hold button, is adapted when depressed to disconnect the speech network from and connect a holding bridge to the associated telephone line.

The key of Jozefowski includes a two pushbutton slide bar associated with each pushbutton pair for interlocking the pushbuttons so that either button may be depressed individually but both buttons may not be depressed simultaneously. The two pushbutton slide bar is designed so that the depression of either of the buttons results in the slide bar being rocked so as to exert an upward force on and raise the other of the pushbuttons.

Jozefowski's key also includes a three pushbutton slide bar associated with each of the adjacent pairs of pushbuttons. The three pushbutton slide bar interlocks the line buttons of the adjacent pushbutton pairs so that either of the line buttons may be depressed individually but both may not be depressed simultaneously. Similar to the two pushbutton slide bar, the three pushbutton slide bar is designed so that when one line button is depressed, the slide bar is displaced so as to exert upward force on and raise the line button of the other pair. The three pushbutton slide bar is also designed so that two such slide bars can be ganged together to interlock the line buttons of three adjacent pairs of pushbuttons. When this combination is used in a six button key, the depression of any line button results in both slide bars being displaced so as to raise any other line button. Finally, the three pushbutton slide bar is designed so that there is no interaction between it and the associated hold buttons.

As a result of the foregoing, in Jozefowski's key only one line button can be depressed at any one time and therefore the speech network of the associated telephone set can only be connected to one telephone line at any one time. Further, while all of the hold buttons can be depressed simultaneously to place one or more lines on hold, the depression of a hold button only results in the raising of its associated line button. It does not interact with or serve to raise a line button of another pair.

SUMMARY OF THE INVENTION

A multiple switch in accordance with the present invention comprises a plurality of pushbuttons that are movable between an extended and a depressed position and are biased toward the extended position. The pushbuttons are paired and each pushbutton pair is associated with an individual lockout, a releasing-latching bar (RL bar) that is common to all of the pairs, and an individual releasing-nonlatching and releasing-latching bar (RNRL bar). Each pushbutton interacts with all three members when it is depressed.

The lockout permits either pushbutton of the associated pair to be depressed individually but prevents both pushbuttons from being depressed simultaneously. As any pushbutton is depressed, the RL bar acts to release all pushbuttons previously depressed and latches the activated pushbutton in its depressed position. Finally, the RNRL bar interacts with a first pushbutton of the associated pair to release the second pushbutton of the pair if it was previously depressed and interacts with the second pushbutton of the associated pair to latch it in its depressed position. Each RNRL bar interacts with the associated pushbutton pair in conjunction with the RL bar but independent of any other RNRL bar.

As a result of the foregoing, either pushbutton of any pair can be depressed simultaneously with either pushbutton of any other pair. In addition, if one or more of the first pushbuttons of the pairs is in its depressed position, it is released therefrom when any other pushbutton is thereafter depressed. If, on the other hand, one or more of the second pushbuttons of the pairs is in its depressed position, it remains in its depressed position if any pushbutton other than the first pushbutton of its pair is thereafter depressed.

If the multi-button switch of the present invention is used as a key of a telephone set in which the first pushbutton of each pair is a line button and the second pushbutton of each pair is the associated hold button, then the following features are provided. The operation of any line button releases all other line buttons to provide line selection and releases its companion hold button to recapture a line that is on hold. In addition the simultaneous depression of two or more line buttons interconnects the lines for conferencing purposes. Furthermore, the depression of any hold button releases its companion line button to place the line on hold and releases any other line button should a conference call have been in process.

DESCRIPTION OF THE DRAWING

FIG. 1 is an exploded perspective view of a multi-button multiple switch embodying the present invention;

FIG. 2 is a perspective view of the switch showing most of the components assembled; and FIG. 3 is a plan view partially broken away showing the other side of the switch and the interaction between the pushbuttons and the contact springs of the switch.

DETAILED DESCRIPTION OF THE INVENTION

Referring to FIGS. 1 and 2 of the drawing, a multiple switch in accordance with the present invention includes a unitary dielectric housing 12 comprising a generally planar base portion 14 having six equally spaced sleeve portions 15, a pair of transverse wall portions 16, and a longitudinal wall portion 18 extending upwardly therefrom. The sleeve portions 15 are aligned in a row intermediate the front and rear edges of the base portion 14.

The transverse wall portions 16 extend along the side edges of the base portion 14 generally orthogonal to and spaced from the row of sleeve portions 15, while the longitudinal wall portion 18 extends generally parallel to and spaced from the row of sleeve portions. The longitudinal wall portion 18 has a plurality of equally spaced guide slots 20 therein, and each guide slot is in alignment with an individual sleeve portion 15. In addition, the longitudinal wall portion 18 in combination with the transverse wall portions 16 provides a rectangular recess 22.

Referring now also to FIG. 3, the rear edge of the base portion 14 includes a plurality of spaced stop portions 24. The stop portions 24 serve to locate certain ones of a plurality of contact springs 30 that are arranged in pile-ups along the length of the base portion 14 and extend generally parallel to the axes of the sleeve portions 15.

Respectively disposed about the sleeve portions 15 are pushbuttons 34A through 34F, each pushbutton having a central aperture therein that conforms to its associated sleeve portion. Each pushbutton 34 includes a raised guide portion 35 on one side thereof that is accommodated by the adjacent guide slot 20 in the longitudinal wall portion 18. These elements cooperate to permit each pushbutton 34 to move up and down along the length of its associated sleeve portion 15, but prevent the pushbutton from rotating about the sleeve portion.

The opposite side of each pushbutton 34 includes a raised cam portion 36 that extends into juxtaposition with individual ones of the contact springs 30. Some of the contact springs 30 are pre-tensioned against the stop portions 24 of the base portion 14, while other contact springs are pre-tensioned against the cam portions 36 of the pushbuttons 34. The cam portions 36 interact with these latter contact springs 30 to deflect the contact portions thereon into the out of engagement with the contact portions of the adjacent contact springs. Consequently, each pushbutton 34 serves as a switch actuator.

A compression spring 40 disposed about each sleeve portion 15 of the housing 12 between the associated pushbutton 34 and the base portion 14 of the housing biases the pushbuttons upwardly. When one of the pushbuttons 34 is depressed, the associated spring 40 is compressed within an annular slot (not shown) in the underside of the pushbutton. As a result, the downward movement of each pushbutton 34 is limited by its engagement with the base portion 14.

A cover member 50 is disposed about and secured to the housing 12, and the top of the cover member is provided with an elongated opening 52 that is of a size to permit the upper ends of the pushbuttons 34 but not the guide portions 34 and cam portions 36 to pass therethrough. Hence, the engagement of the guide portions 35 and cam portions 36 with the underside of the cover member 50 limits the upward movement of the pushbuttons 34.

The cover member 50 includes a skirt portion 54 that cooperates with the longitudinal wall portion 18 to retain a plurality of planar interacting members within the recess 22 of the housing 12. The interacting members comprise three lockouts 60, a single releasing-locking bar 70, hereinafter referred to as the RL bar, and three combined releasing-nonlocking and releasing-locking bars 80, hereinafter referred to as the RNRL bars.

The lockouts 60, the RL bar 70, and the RNRL bars 80 lie in adjacent parallel planes and they cooperate with a plurality of drivers 90, which are respectively mounted to the guide portions 35 of the pushbuttons 34, to control the interaction between the pushbuttons. Each driver 90 comprises a disc 92 that lies in the same plane as the lockouts 60 and a pin 94 that extends into the planes of the RL bar 70 and the RNRL bars 80.

The lockouts 60 comprise generally triangular-shaped members having inclined sides 62, and the lockouts rest on and are rectilinearly displaceable along the bottom surface of the recess 22. As shown most clearly in FIG. 1, each lockout 60 is located contiguously to the longitudinal wall portion 18 between the guide slots 20 of a unique pair of pushbuttons 34. That is, the pushbuttons 34 between which each lockout 60 is positioned have no other lockout positioned immediately adjacent thereto.

Each lockout 60 is shaped so that when it is centered between the associated pair of pushbuttons 34, the inclined sides 62 of the lockout lie in the path of the disc 92 of the drivers 90 mounted on the pushbuttons. Furthermore, each lockout 60 is shaped so that if both pushbuttons 34 of the associated pair are depressed simultaneously, their downward movement is blocked by the engagement of the discs 92 of their drivers 90 with the sides 62 before either pushbutton can be depressed far enough to actuate the associated contact springs 30 or to be latched, in the manner hereinafter described, in its depressed position.

When one of the pushbuttons 34 of an associated pair is depressed, the disc 92 of the driver 90 on the pushbutton engages the adjacent inclined side 62 of the lockout 60 and displaces it laterally. This lateral displacement moves more of the lockout 60 into the path of the disc 92 of the driver 90 on the other pushbutton 34 of the pair. Thus, if one pushbutton 34 of the pair is manually held in the depressed position, the other pushbutton cannot be depressed.

The RL bar 70 is positioned in front of the lockout 60 and, like the lockouts, rests on and is rectilinearly displaceable along the bottom surface of the recess 22. The RL bar 70 comprises an elongated base portion 71 having six spaced profile portions 72 extending upwardly therefrom. Each profile portion 72 includes a deflecting surface 73 that extends obliquely to the RL bar's line of displacement, a releasing surface 74 that extends generally perpendicularly to the bar's line of displacement, and a latching surface 75 that extends generally parallel to the bar's line of displacement. These surfaces on each profile portion 72 are identical, and the upper ends of the deflecting surfaces 73 are higher than the pins 94 of the drivers 90 when the pushbuttons 34 are in their upward position, while the latching surfaces 75 are higher than the pins when the pushbuttons are in their depressed position.

The spacing between the releasing surfaces 74 of the profile portions 72 is the same as the spacing between the pins 94 of the drivers 90 on the pushbuttons 34. In addition, a compression spring 79, which is disposed between the right hand profile portion 72 and the right transverse wall 16, biases the RL bar 70 so as to move the deflecting surfaces 73 into engagement with the pins 94 on the pushbuttons 34 in their upward position and move the latching surfaces 75 over the pins on the pushbuttons in their depressed position.

The RNRL bars 80 are positioned side by side one another in front of the RL bar 70. Each RNRL bar is also positioned in front of an individual lockout 60, each RNRL bar thereby being associated with the same pair of pushbuttons 34 as the lockout therebehind. Like the lockouts 60, the RNRL bars 80 rest on and are individually rectilinearly displaceable along the bottom surface of the recess 22.

Each RNRL bar 80 comprises an elongated base portion 81 having a pair of spaced profile portions 82 and 86 extending upwardly therefrom. The profile portion 82 includes a deflecting surface 83, a releasing surface 84, and a latching surface 85 that are shaped the same as the deflecting surface 73, releasing surface 74 and latching surface 75 of the profile portion 72 of the RL bar 70. The profile portion 86 is identical to the profile portion 82, except that it only includes a deflecting surface 87 and a releasing surface 88. It does not include a latching surface.

Like the RL bar 70, the spacing between the releasing surfaces 84 and 88 is the same as the spacing between the drivers 90 on the pushbuttons 34, and each RNRL bar 80 is biased so as to move the deflecting surfaces 83 and 87 thereof into engagement with the second portions 94 of the drivers on the pushbuttons in their upward position. The bias is provided by individual expansion spring members 89 which are respectively connected between each RNRL bar 80 and the skirt portion of the cover member 50.

DESCRIPTION OF OPERATION

As a result of the foregoing relationships, the pushbuttons 34 are grouped in pairs 34A–34B, 34C–34D, and 34E–34F, each pair interacting with an individual lockout 60 and RNRL bar 80. With all of the pushbuttons 34 in their upward position, the pin 94 of the driver 90 on each pushbutton is in engagement with the deflecting surface 73 on the adjacent profile portion 72 of the RL bar 70 and either the deflecting surface 83 on the adjacent profile portion 82 or the deflecting surface 87 on the adjacent profile portion 86 of the associated RNRL bar 80.

Thus when any pushbutton 34 is depressed, it displaces both the RL bar 70 and the associated RNRL bar 80 laterally to the right. This lateral displacement continues until the downward movement of the pushbutton 34 places the pin 94 thereon in juxtaposition with the releasing surface 74 on the adjacent profile portion 72 of the RL bar 70 and either the releasing surface 84 on the adjacent profile portion 82 or the releasing surface 88 on the adjacent profile portion 86 of the associated RNRL bar 80.

Further downward movement of the pushbutton 34 moves the pin 94 thereon beneath the latching surface 75 on the adjacent profile portion 72 of the RL bar 70, and the RL bar under the bias of the spring 79 is immediately displaced leftward back to its original position. The pin 94 on the depressed pushbutton 34 is thereby captured beneath the latching surface 75, and the pushbutton is latched in its downward position. At the same time the cam portion 36 (FIG. 3) on the pushbutton 34 deflects the contact springs 30 pre-tensioned thereagainst into engagement with adjacent contact springs to actuate the switch associated with the pushbutton.

If the depressed pushbutton 34 is the right hand pushbutton of its pair, i.e., pushbuttons 34B, 34D, or 34F, and pin 94 of the driver 90 on the pushbutton moves beneath the latching surface 85 on the profile portion 82 of the associated RNRL bar 80 at the same time as it moves beneath the latching surface 75 on the adjacent profile portion 72 of the RL bar 70. Consequently the associated RNRL bar 80 under the bias of its spring 89 is displaced leftward simultaneously with the RL bar 70, and the pin 94 on the depressed pushbutton 34 is captured beneath both the latching surface 75 of the RL bar and the latching surface 85 of the RNRL bar.

If on the other hand, the depressed pushbutton 34 is the left hand pushbutton of its pair, i.e., pushbutton 34A, 34C, or 34E, the pin 94 remains in engagement with the releasing surface 88 on the profile portion 86 of the associated RNRL bar 80. As illustrated in FIG. 2, the associated RNRL bar 80 then remains in its laterally displaced position and the pin 94 on the depressed pushbutton 34 is only captured beneath the latching surface 75 of the RL bar 70.

As a result, of the above, if one or more of the pushbuttons 34A, 34C, or 34E is in its depressed position, it is released therefrom when any other pushbutton is thereafter depressed. This is because the spacing between the releasing surfaces 74 on all of the profile portions 72 of the RL bar 70 is identical to the spacing between the pins 94 of the drivers 90 on all of the pushbuttons 34. Thus when the pin 94 on the subsequently depressed pushbutton 34 displaces the RL bar 70 to the point where the pin is positioned in engagement with the releasing surface 74 on the adjacent profile portion 72, the pin on the previously depressed pushbuttons 34A, 34C or 34E is no longer captured beneath the latching surface 75 on its adjacent profile portion of the RL bar, and the pushbutton returns to its upward position under the bias of its associated spring 40.

Conversely, if one or more of the pushbuttons 34B, 34D, or 34F is in its depressed position, it remains in its depressed position if any pushbutton other than its companion pushbutton is thereafter depressed. This is because although the RL bar 70 is displaced as above, the pin 90 on the previously depressed pushbutton 34B, 34D, or 34F is still captured beneath the latching surface 85 on the adjacent profile portion 82 of the associated RNRL bar 80.

If, however, the other pushbutton 34 of its pair is depressed, both the RL bar 70 and the associated RNRL bar 80 are displaced. Since the spacing between the releasing surfaces 84 and 88 on the profile portions 82 and 86 of all the RNRL bars 80 is, like the releasing surfaces 74 on the RL bar 70, identical to the spacing between the pins 94 of the drivers 90 on all of the pushbuttons 34, this displacement of both the RL bar and the associated RNRL bar results in the pin 94 on the previously depressed pushbutton 34B, 34D, or 34F no longer being captured. This pushbutton therefore returns to its upward position under the bias of its associated spring 40.

Finally, although the above interaction occurs between the pushbuttons 34 there is an independence between the pairs of pushbuttons in the sense that either pushbutton of a pair can be depressed simultaneously with either pushbutton of any other pair. In a like manner, because the pushbuttons 34 are moved upward by their associated springs 40, any of the pushbuttons 34A, 34C, or 34E which would be normally released by the subsequent depression of any other pushbutton can be manually retained in its downward position as long as the subsequently depressed pushbutton is not the other pushbutton of its pair.

It follows from the foregoing that if the multi-button switch of the present invention is used as the key of a telephone set in which the pushbuttons 34A, 34C, and 34E serve to connect the telephone set to individual telephone lines, i.e., each is a line button, and each of the pushbuttons 34B, 34D, and 34F serves to place a holding bridge across the telephone line of the associated line button, i.e., each serves as a hold button, then the following features are provided. A subscriber initiates or answers a call by depressing the line button of the desired telephone line. The depressed button latches down and releases any other line button that had been previously latched down. However, if it is desired to have a conference call, two or all three of the telephone lines are interconnected by simultaneously depressing or holding down the line buttons, and the simultaneously depressed or held down line buttons all latch down.

An active line is placed on hold by depressing the hold button associated with the line. The depressed hold button latches down and releases the associated line button. In addition it releases all other latched down line buttons unless they are held down at the same time that the hold button is depressed. Thus a conference call can be terminated and an individual telephone line held by depressing the hold button of that line. A depressed hold button does not, however, release any other latched down hold button. So one, two or all three telephone lines may be placed on hold at the same time.

To recapture a line that is on hold, the associated line button is depressed and this releases the associated hold button. In order not to interfere with any of the other telephone lines that are on hold, a depressed line button does not release any hold button other than the one associated therewith.

It is to be understood that the embodiment described herein is merely illustrative of the principles of the invention. Various modifications may be made thereto by persons skilled in the art without departing from the spirit and scope of the invention as defined in the appended claims.

What is claimed is:

1. A multiple switch comprising a multiplicity of switch actuators each of which is movable between a first and a second position, the switch actuators being associated in a multiple of pairs, each pair consisting of a first and a second switch actuator, and means for providing interaction between the switch actuators responsive to the movement of the switch actuators, the interaction means permitting all of the first switch actuators that are in the second position to move to the first position responsive to the movement of the second switch actuator of any pair to the second position, the interaction means retaining in the second position all other second switch actuators in the second position.

2. A multiple switch as in claim 1 wherein the interaction means permits only one switch actuator of each pair to be positioned in the second position at any one time and permits either one of the switch actuators of each pair to be positioned in the second position independent of the position of the switch actuators of the other pairs.

3. A multiple switch as in claim 2 wherein the interaction means causes the second switch actuator of a pair when in the second position to move to the first position responsive to the movement of the associated first switch actuator to the second position and permits all other first switch actuators in the second position to move to the first position, the interaction means retaining in the second position all other second switch actuators that are in the second position.

4. A multiple switch comprising a multiplicity of switch actuators each of which is movable between a first and a second position and biased toward the first position, the switch actuators being associated in a multiplicity of pairs, each pair consisting of a first and a second switch actuator, and means for providing interaction between the switch actuators responsive to the movement of the switch actuators, the interaction means releasing the first switch actuator of any pair that is in the second position and permitting it to return to the first position when any other switch actuator is moved to the second position, and the interaction means retaining in the second position the second switch actuator of any pair that is in the second position when any switch actuator other than the first switch actuator of its pair is moved to the second position.

5. A multiple switch as in claim 4 wherein the interaction means permits only one switch actuator of each pair to be positioned in the second position at any one time and permits either one of the switch actuators of each pair to be positioned in the second position independent of the position of the switch actuators of the other pairs.

6. A multiple switch comprising a multiplicity of switch actuators each of which is movable between a first and a second position and biased toward a first position, the switch actuators being associated in a multiplicity of pairs, each pair consisting of a first and a second switch actuator, and means for providing interaction between the switch actuators responsive to the movement of the switch actuators, the interacting means comprising a first member that is common to all of the pairs of switch actuators and a plurality of second members that are respectively associated with each individual pair, the common member acting to allow the release of all switch actuators previously moved to the second position and latching any switch actuator in the second position responsive to the movement of that switch actuator to the second position, and each individual member releasing the second switch actuator of its associated pair from the second position responsive to the movement of the first switch actuator of the pair to the second position and latching the second switch actuator of its associated pair in the second position and releasing the first switch actuator of the pair from the second position responsive to the movement of the second switch actuator to the second position.

7. A multiple switch as in claim 6 wherein the switch actuators are arranged in a row and are reciprocally movable between an extended and a depressed position, and each switch actuator includes a driver for linearly displacing the common member and the associated individual member in a first direction generally parallel to the row of switch actuators and generally orthogonal to the path of movement of the switch actuators, the common member and each of the individual members being biased opposite to the first direction.

8. A multiple switch as in claim 7 wherein each individual member includes a pair of spaced profile portions respectively engaged by the drivers of the associated pair of switch actuators.

9. A multiple switch as in claim 8 wherein a first of the profile portions of each individual member includes a deflecting surface that extends obliquely to the member's line of displacement, and a releasing surface that extends generally perpendicular to the member's line of displacement, and the second of the profile portions of each individual member includes a deflecting surface and a releasing surface that respectively extend parallel to the deflecting surface and releasing surface of the first profile portion and are spaced therefrom the same as the spacing between the drivers on the associated pair of switch actuators, the second of the profile portions also including a latching surface that extends generally parallel to the member's line of displacement.

10. A multiple switch as in claim 9 wherein the bias applied to each of the individual members acts to move the deflecting surfaces of the first and second profile portions into engagement with the drivers on the associated switch actuators in their extended position and acts to move the latching surface of the second profile portion over the driver on an associated switch actuator in its depressed position.

11. A multiple switch as in claim 10 wherein the common member includes an individual profile portion associated with each switch actuator and each profile portion associated with each switch actuator and each profile portion includes a deflecting surface, releasing surface, and latching surface that are the same as the deflecting, releasing, and latching surfaces on the second profile portion of the individual member.

12. A multiple switch as in claim 11 wherein the deflecting surfaces and the releasing surfaces of the common member are spaced the same as the spacing between the drivers of the switch actuators and the bias applied to the common member acts to move the deflecting surfaces into engagement with the drivers on the switch actuators in their extended position and acts to move the latching surfaces over the drivers on the switch actuators in their depressed position.

* * * * *